United States Patent
Huang (10) Patent No.: US 6,618,841 B1
(45) Date of Patent: Sep. 9, 2003

(54) NON-ASSIGNABLE SIGNAL SUPPORT DURING FORMAL VERIFICATION OF CIRCUIT DESIGNS

(75) Inventor: Chung-Yang Huang, Fremont, CA (US)

(73) Assignee: Verplex Systems, Inc., Milpitas, CA (US)

( * ) Notice: Subject to any disclaimer, the term of this patent is extended or adjusted under 35 U.S.C. 154(b) by 0 days.

(21) Appl. No.: 09/990,135

(22) Filed: Nov. 20, 2001

Related U.S. Application Data (63) Continuation-in-part of application No. 10/029,596, filed on Oct. 24, 2001.
(60) Provisional application No. 60/246,422, filed on Nov. 6, 2000.

(51) Int. Cl.[7] .............................................. G06F 17/50
(52) U.S. Cl. ........................................................ 716/4
(58) Field of Search .............................................. 716/4

(56) References Cited

U.S. PATENT DOCUMENTS

| | | | | |
|---|---|---|---|---|
| 5,276,897 A |   | 1/1994 | Stalmarck .................... | 395/800 |
| 5,572,535 A | * | 11/1996 | Pixley et al. ................ | 714/724 |
| 5,862,149 A | * | 1/1999 | Carpenter et al. ........... | 714/726 |
| 5,937,183 A |   | 8/1999 | Ashar et al. ............ | 395/500.34 |
| 6,038,392 A |   | 3/2000 | Ashar et al. ............ | 395/500.48 |
| 6,079,040 A | * | 6/2000 | Hom et al. .................. | 714/738 |
| 6,247,164 B1 | * | 6/2001 | Ashar et al. ..................... | 716/5 |
| 6,301,687 B1 | * | 10/2001 | Jain et al. ....................... | 716/3 |
| 6,327,687 B1 | * | 12/2001 | Rajski et al. ................ | 714/738 |
| 6,334,200 B1 | * | 12/2001 | Fujiwara et al. ............ | 714/738 |
| 6,564,358 B2 | * | 5/2003 | Moondanos et al. ........... | 716/5 |

OTHER PUBLICATIONS

Chung–Yang Huang et al., "Static property checking using ATPG vs. BDD techniques." Test Conference, 2000 Proceedings International, Page(s): 309–316.*

(List continued on next page.)

*Primary Examiner*—Matthew Smith
*Assistant Examiner*—Andrea Liu
(74) *Attorney, Agent, or Firm*—Kenta Suzue; Wilson Sonsini, Goodrich & Rosati (57) ABSTRACT

A method for supporting non-assignable signals during formal verification of a circuit design includes providing a propagation logic for non-assignable signals and identifying a relevant cone in a circuit design, where the relevant cone determined by a property to verify. The method also includes designating one or more signals in the circuit design as non-assignable signals and propagating within the relevant cone any of the designated one or more non-assignable signals using the propagation logic for non-assignable signals. The method further includes ensuring, if a counterexample disproving the property exists, that the counterexample does not comprise any of the one or more designated non-assignable signals. A formal verification system that supports the designation of non-assignable signals comprises a non-assignable signal truth table and a proof engine. The non-assignable signal truth table specifies a propagation logic for non-assignable signals. The proof engine is coupled to the non-assignable truth table, and is operable to determine a property to verify in a circuit. The proof engine is also operable to identify a relevant cone in the design circuit based on the property, where the relevant cone comprises a plurality of signals. The proof engine is further operable to designate one or more signals as non-assignable and propagate the non-assignable signals using the propagation logic from the non-assignable signal truth table, and ignore the non-assignable signals in generating any counter-example.

25 Claims, 5 Drawing Sheets

OTHER PUBLICATIONS

N. Malik et al. "A toolset for assisted formal verification." Performance, Computing and Communications Conference, 1999. '99. IEEE International, Feb. 10–12, 1999. pp 489–492.*

Chang–Yang (Ric) Huang, et al.; "Using Word Level ATPG and Modular Arithmetic Constraint–Solving Techniques for Assertion Property Checking"; IEEE Transactions on Computer–Aided Design of Integrated Circuits and Systems, vol. 20, No. 3, Mar. 2001; pp. 381–391.

Farzan Fallah, et al.; "Functional Vector Generation for HDL models Using Linear Programming and 3–Satisfiability"; Proceedings of 1998 Design Automation Conference; Jun. 15–19, 1998; pp. 528–533.

Ranga Vemuri, et al.; "Generation of Design Verification Tests from Behavioral VHDL Programs Using Path Enumeriation and Constraint Programming"; IEEE Transactions on Very Large Scale Integration (VLSI) Systems; vol. 3, No. 2, Jun. 1995; pp. 201–214.

"Murphi Description Language and Automated Verifier"; http://sprout.stanford.edu/dill/murphi.html; Nov. 7, 2001; pp. 1–6.

Kenneth L. McMillan; "Symbolic Model Checking"; Kluwer Academic Publishers; 1993.

* cited by examiner

Fig. 1

| NOT | U | X |
|---|---|---|
| | U | X |

| AND | 0 | 1 | U | X |
|---|---|---|---|---|
| U | 0 | U | U | X |
| X | 0 | X | X | X |

| OR | 0 | 1 | U | X |
|---|---|---|---|---|
| U | U | 1 | U | X |
| X | X | 1 | X | X |

| XOR | 0 | 1 | U | X |
|---|---|---|---|---|
| U | U | U | U | U |
| X | X | X | U | X |

NON-ASSIGNABLE SIGNAL SUPPORT DURING FORMAL VERIFICATION OF CIRCUIT DESIGNS

RELATED APPLICATION

This application is a continuation-in-part of U.S. application Ser. No. 10/029,596, filed Oct. 24, 2001, which claims the benefit of priority to U.S. provisional application No. 60/246,422, filed on Nov. 6, 2000, which is incorporated herein by reference in their entirety.

BACKGROUND

1. Field

The present invention relates generally to formal verification of circuit designs and, more particularly, to the support of non-assignable signal designations in a circuit design during formal verification.

2. Description of the Related Art

With the increasing complexity of integrated circuits (ICs), computer-aided design (CAD) and computer-aided engineering (CAE) tools are becoming increasingly important in assisting and enabling circuit designers produce the complicated ICs. An ongoing problem in the design of these complex circuit designs is verifying that the circuit design behaves in the manner intended by its designer. Formal verification is a generally accepted method of verifying the correctness of a circuit design.

Formal verification involves verifying or proving one or more properties of a circuit design. A property is some relation, either logical (Boolean) or temporal, between one or more signals in the circuit design. The property can be considered as a signal that is generated by the relation between the signals in the circuit design. Formal verification is used to verify that the circuit property holds for all combinations of input sequences over time. To verify that a property holds, conventional formal verification tools or methods search all the circuit state space and ensure that the property is not contradicted. The formal verification tool tries to show an instance of property NOT (e. g., assuming that the property is designated by P, the formal verification tool tries to find an instance of P NOT) to show an existence of a contradiction. If a contradiction exists, the property does not hold (i.e., the property is disproved).

Conventional formal verification tools check the circuit design and produce a counter-example to indicate an existence of a contradiction. A counter-example is typically a test sequence that disproves a property (e.g., the test sequence shows the existence of property NOT). A test sequence is a sequence of assignments on, for example, the primary input signals or certain internal signals in the circuit design.

In a typical formal verification process, if a counter-example is produced or generated, a designer checks to see what signals caused the counter-example. In checking the signals, the designer may determine that the counter-example was caused by or involved or included one or more non-assignable signals. A non-assignable signal is a signal that is not to be assigned to a value (i.e., a signal that that should not have an assignment to a value). For example, the signal may be associated with a portion of the circuit design that is incomplete and, thus, should not be assigned a value. If the counter-example includes a non-assignable signal, it is not a "true" counter-example, and the designer typically requests the formal verification tool to generate the next counter-example, if one exists.

A drawback with conventional formal verification tools is that it does not support non-assignable signals. Thus, the designer has to expend time and resources to check and verify that a generated counter-example is a true counter-example and not a counter-example that includes what the designer considers a non-assignable signal. What is needed is a formal verification tool or method that enables the designer to designate certain signals in the circuit design as non-assignable, and that verifies the circuit design by accounting for the designated non-assignable signals. Using a formal verification tool that supports the designation of non-assignable signals, the designer can be assured that any counter-example generated is a true counter-example.

SUMMARY

Embodiments of the present invention overcome many of the aforementioned disadvantages by providing a formal verification system and method that supports non-assignable signals. The formal verification system enables a user (e.g., a circuit designer) to specify one or more non-assignable signals in a circuit design. The signals are generally associated with circuit elements or variables, such as, by way of example, black-box pins, floating elements, unknown initial values from combinatorial circuits or loops, flip-flops, latches, unknown values due to bus contention, and the like.

In one embodiment, the formal verification system identifies or tags non-assignable signals by assigning a value to each non-assignable signal in a circuit design. The formal verification system ensures that non-assignable signals are not identified as decision signals during formal verification of the circuit design. The formal verification system utilizes a non-assignable truth table, which specifies propagation logic for the non-assignable signal, to propagate the non-assignable signals while performing logic implication during formal verification of the circuit design. Thus, the formal verification system ensures that any counter-example produced does not include a non-assignable signal.

In another embodiment, the formal verification system utilizes the non-assignable truth table to generate a function, such as, by way of example, a Binary Decision Diagram (BDD), for the property NOT (e.g., a function that shows a counter-example and that disproves the property). In particular, the formal verification system utilizes the propagation logic for the non-assignable signal specified in the non-assignable truth table to propagate the non-assignable signals while generating the function for the property NOT. Because the generated function accounts for the non-assignable signals, the formal verification system can ensure that that any counter-example produced does not include a non-assignable signal.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein.

A technical advantage of the present invention includes providing a formal verification system and method that supports non-assignable signals in performing formal verification of a circuit design. A circuit designer can perform formal verification on an unfinished or incomplete circuit design by specifying or designating the signals associated with the incomplete portion of the circuit design as non-assignable. The formal verification system accounts for the non-assignable signals by ensuring that any counterexample produced does not include a non-assignable signal. Thus, the designer is able to perform formal verification in stages.

Anther technical advantage of the present invention includes providing a more efficient formal verification system and method. The designer is able to designate parts or sections of the circuit design that the formal verification system is not to verify. For example, the designer can designate certain parts or sections of the circuit design (e.g., incomplete parts of the circuit design, golden parts of the circuit design, etc.) that is not to be the cause of a counter-example. The formal verification system need not verify these designated sections (i.e., the designated non-assignable signals) and, thus, is more efficient in performing formal verification of the remaining parts or sections (i.e., non-designated or assignable signals) of the circuit design.

These and other embodiments of the present invention will also become readily apparent to those skilled in the art from the following detailed description of the embodiments having reference to the attached figures, the invention not being limited to any particular embodiment(s) disclosed.

DETAILED DESCRIPTION

The embodiments of the present invention and their advantages are better understood by referring to FIGS. 1 through 5 of the drawings. Throughout the drawings, like numerals are used for like and corresponding parts of the various drawings.

Turning first to the nomenclature of the specification, the detailed description that follows is presented largely in terms of processes and symbolic representations of operations performed by conventional computers, including computer components. A computer may be any microprocessor or processor (hereinafter referred to as processor) controlled device such as, by way of example, personal computers, workstations, servers, clients, mini-computers, main-frame computers, laptop computers, a network of one or more computers, mobile computers, portable computers, handheld computers, palm top computers, set top boxes for a TV, interactive televisions, interactive kiosks, personal digital assistants, interactive wireless devices, mobile browsers, or any combination thereof. The computer may possess input devices such as, by way of example, a keyboard, a keypad, a mouse, a microphone, or a touch screen, and output devices such as a computer screen, printer, or a speaker. Additionally, the computer includes memory such as a memory storage device or an addressable storage medium.

The computer may be a uniprocessor or multiprocessor machine. Additionally the computer, and the computer memory, may advantageously contain program logic or other substrate configuration representing data and instructions, which cause the computer to operate in a specific and predefined manner as, described herein. The program logic may advantageously be implemented as one or more modules. The modules may advantageously be configured to reside on the computer memory and execute on the one or more processors. The modules include, but are not limited to, software or hardware components that perform certain tasks. Thus, a module may include, by way of example, components, such as, software components, processes, functions, subroutines, procedures, attributes, class components, task components, object-oriented software components, segments of program code, drivers, firmware, micro-code, circuitry, data, and the like.

The program logic conventionally includes the manipulation of data bits by the processor and the maintenance of these bits within data structures resident in one or more of the memory storage devices. Such data structures impose a physical organization upon the collection of data bits stored within computer memory and represent specific electrical or magnetic elements. These symbolic representations are the means used by those skilled in the art to effectively convey teachings and discoveries to others skilled in the art.

The program logic is generally considered to be a sequence of computer-executed steps. These steps generally require manipulations of physical quantities. Usually, although not necessarily, these quantities take the form of electrical, magnetic, or optical signals capable of being stored, transferred, combined, compared, or otherwise manipulated. It is conventional for those skilled in the art to refer to these signals as bits, values, elements, symbols, characters, text, terms, numbers, records, files, or the like. It should be kept in mind, however, that these and some other terms should be associated with appropriate physical quantities for computer operations, and that these terms are merely conventional labels applied to physical quantities that exist within and during operation of the computer.

The program logic can be maintained or stored on a computer-readable storage medium. The term "computer-readable storage medium" refers to any medium that participates in providing the symbolic representations of operations to a processor for execution. Such media may take many forms, including, without limitation, volatile memory, nonvolatile memory, electronic transmission media, and the like. Volatile memory includes, for example, dynamic memory and cache memory normally present in computers. Nonvolatile memory includes, for example, optical or magnetic disks.

It should be understood that manipulations within the computer are often referred to in terms of adding, comparing, moving, searching, or the like, which are often associated with manual operations performed by a human operator. It is to be understood that no involvement of the human operator may be necessary, or even desirable. The operations described herein are machine operations performed in conjunction with the human operator or user that interacts with the computer or computers.

It should also be understood that the programs, modules, processes, methods, and the like, described herein are but an exemplary implementation and are not related, or limited, to any particular computer, apparatus, or computer language. Rather, various types of general purpose computing machines or devices may be used with programs constructed in accordance with the teachings described herein. Similarly, it may prove advantageous to construct a specialized apparatus to perform the method steps described herein by way of dedicated computer systems with hard-wired logic or programs stored in non-volatile memory, such as, by way of example, read-only memory (ROM).

Overview

Figure 1:
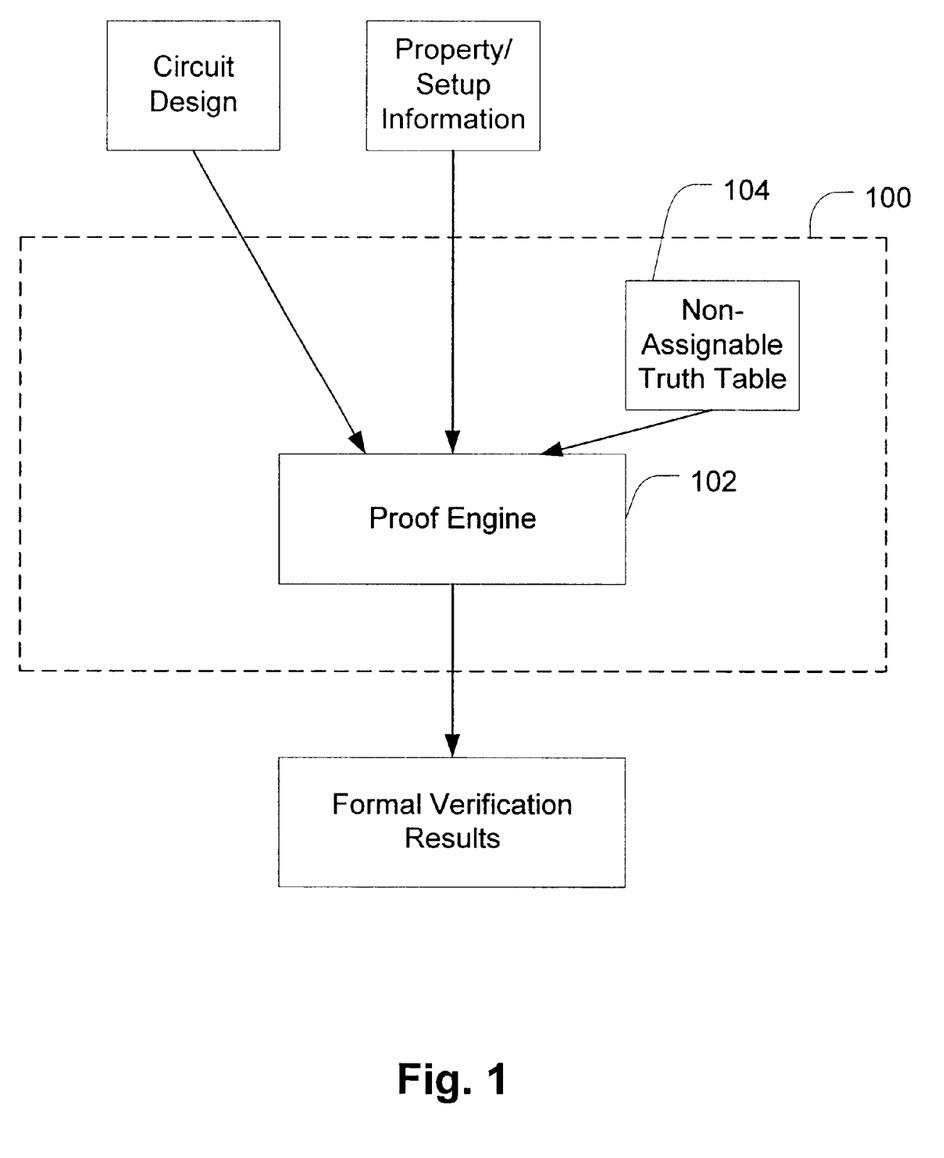
FIG. 1 illustrates exemplary components of a formal verification system, ccording to one embodiment.

FIG. 1 illustrates exemplary components of a formal verification system 100, according to one embodiment. Verification system 100 supports non-assignable signals during circuit design verification by ignoring the non-assignable signals in generating any counter-examples. As used herein, the terms "non-assignable," "non-assignable signal," and "non-assignable signal value," and any variant thereof are used interchangeably and refer to a value that cannot be "0" nor "1". For example, a non-assignable signal cannot have, be associated with, or carry a value of "0" or "1". Thus, verification system 100 facilitates the designation of one or more signals as non-assignable (i.e., the signal has a value defined as non-assignable) in a circuit and ensures that any counter-example that is generated during the formal verification process is a true counter-example. A true-counter example is a counter-example that does not include a signal having a non-assignable value (e.g., a non-assignable signal is not a cause of the counter-example).

As used herein, "0" refers to logical low or false, "1" refers to logical high or true, "U" refers to non-assignable (e.g., logical non-assignable), and "X" refers to don't-care (e.g., logical don't-care) or unknown (e.g., logical unknown). Those of skill in the art will appreciate that in certain embodiments and implementations, the logical values can be switched or flipped without departing from the essence of the invention.

As depicted, verification system 100 includes a proof engine 102 coupled to a non-assignable truth table 104. Proof engine 102 performs the primary functions to verify a circuit design or parts of a circuit design. Non-assignable truth table 104 is a logic operation table that describes the logic function for the non-assignable signal value by listing all possible combinations of input values and indicating, for each combination, the output values. The logic function for the non-assignable signal is further discussed below in conjunction with FIG. 2.

In one embodiment, proof engine 102 receives as input a circuit design that describes a circuit. A circuit designer or other user wanting to verify certain properties of the circuit can provide the circuit design. The circuit design is typically specified by hardware description language (HDL) codes such as, by way of example, register-transfer level (RTL) Verilog or very high-speed integrated circuit hardware description language (VHDL) codes.

Proof engine 102 also receives as input setup and property information for the circuit design. Proof engine 102 uses the setup and property information to create or setup an environment that is needed to verify the circuit design. The setup information can include information such as, by way of example, an initialization sequence, environmental setup information, one or more non-assignable signal designations, and the like.

The initialization sequence is applied to derive a set of initial states for the circuit and is used to reset the circuit to a known state. The environmental setup information defines constraints on the circuit inputs such as clock waveform(s), relations between signals in the circuit, signal characteristics, etc. Environmental setup information can be used to indicate, for example, relationships between various signals, signal characteristics (e.g., reset signal should be inactive during normal operation of the circuit), and the like.

The non-assignable signal designations specify the signals in the circuit that are to be non-assignable.

Figure 2:
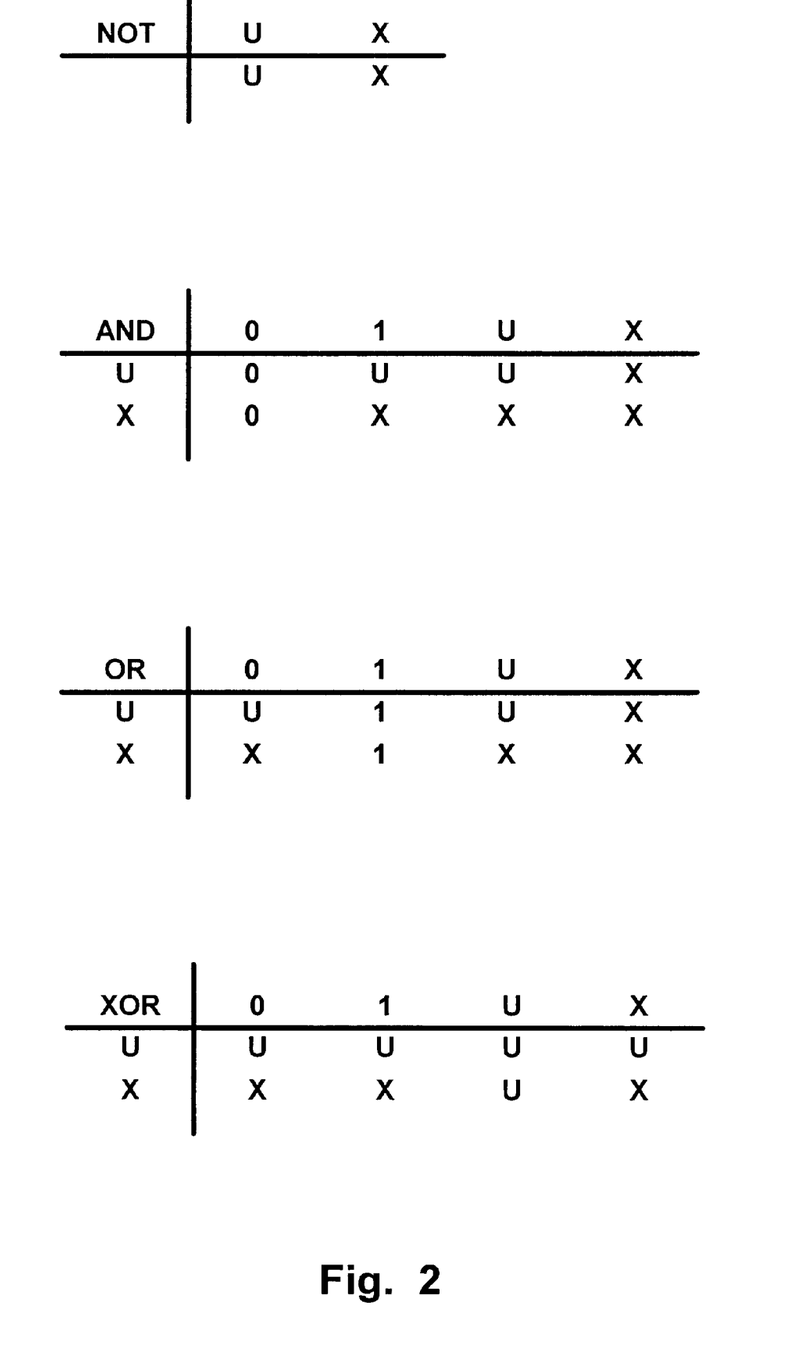
FIG. 2 is a truth table illustrating the logic for a non-assignable signal.

Property information specifies some relation (can be logical (Boolean) or temporal) between certain signals in the circuit design. The property information is typically provided by a user and specifies a part or all of the circuit design that is to be verified or proved. Proof engine 102 uses the non-assignable logic function specified in non-assignable truth table 104 in performing formal verification of the property or properties and generating the formal verification results. In another embodiment, verification system 100 can provide a default property (e.g., bus contention checking) to be verified.

Proof engine 102 creates an internal data representation of the circuit from the received data. Proof engine 102 synthesizes/maps the HDL design into a netlist of high-level primitives, such as, by way of example, an RTL netlist. The RTL netlist includes circuit elements, such as, by way of example, Boolean gates, arithmetic units, comparators (data-to-control), multiplexers and tristate elements (control-to-data), multiple-driven nets (called bus gates), and memory elements (flip flops and latches). The circuit can then be viewed as an interconnection of circuit elements coupled by one or more signals.

In one embodiment, proof engine 102 provides a default set of one or more non-assignable signals. The default set of non-assignable signals can include, by way of example, signals such as, black-box outputs, unknown values due to bus contention, floating point signals, etc. Verification system 100 can provide an interface, such as a graphic user interface, program interface, and the like, that functions to provide access to the default set of non-assignable signals. Using the provided interface, a user can view the default set of non-assignable signals, modify (i.e., change a non-assignable signal to an assignable signal) the default set of non-assignable signals, and specify additional non-assignable signals.

In one embodiment, proof engine 102 models a property to be verified as an attached circuit with a single output signal as the proposition of the property. To prove that the property holds (e.g., for all combinations of input signal value sequences over time), proof engine 102 inverts the property to produce a counter-example-generation problem. For example, assuming that the property to verify is designated as P, proof engine 102 tries to verify P by searching for an instance of P NOT. P NOT can be considered a vector generation target (or target) and is a circuit condition. A vector generation target can include signals, sequence of signals, and combinations of signals in the circuit. The vector generation target specifies temporal relationships between the signals or signal values and is used to generate the simulation vector(s) needed to exercise the circuit condition specified by the vector generation target (i.e., P NOT). Because proof engine 102 propagates the non-assignable signal values throughout the circuit design, it can ensure that any vector (i.e., counter-example) that satisfies the target P NOT does not include a non-assignable signal value.

The depicted components and modules may communicate with each other and other components comprising verification system 100 through mechanisms such as, by way of example, interprocess communication, procedure and function calls, application program interfaces, and other various program interfaces. Furthermore, the functionality provided for in the components, modules, and databases may be combined into fewer components, modules, or databases or further separated into additional components, modules, or databases. In some embodiments, one or more of the functions provided by the modules, components, and databases may be optional and not implemented or present in verification system 100. For example, instead of proof engine 102, verification system 100, or one or more other components of verification system 100, can create the internal data representation of the circuit from the received data. The created internal data representation can then be input to proof engine 102 for formal verification.

FIG. 2 is a truth table illustrating the logic for a non-assignable signal. Also depicted is the logic for an unknown signal. Each non-assignable signal can be propagated throughout a circuit according to the logic functions in non-assignable truth table 102. As depicted, non-assignable truth table 102 contains logic functions having the following Boolean semantics:

| | |
|---|---|
| ~U = U | ~X = X |
| U * 0 = 0 | X * 0 = 0 |
| U * 1 = U | X * 1 = X |
| U * U = U | X * U = X |
| U * X = X | X * X = X |
| U + 0 = U | X + 0 = X |
| U + 1 = 1 | X + 1 = 1 |
| U + U = U | X + U = X |
| U + X = X | X + X = X |
| U $\oplus$ 0 = U | X $\oplus$ 0 = X |
| U $\oplus$ 1 = U | X $\oplus$ 1 = X |
| U $\oplus$ U = U | X $\oplus$ U = U |
| U $\oplus$ X = U | X $\oplus$ X = X | where, 'U' denotes non-assignable signal value, 'X' denotes an unknown signal value, '1' denotes Boolean true, '0' denotes Boolean false, '~' denotes Boolean NOT, '*' denotes Boolean AND, '+' denotes Boolean OR, and '$\oplus$' denotes Boolean XOR. As used herein, the terms "unknown," "unknown signal," "unknown signal value," and any variant thereof are used interchangeably and refer to a value that can be "0", "1" or "U". Verification system 100 can use the aforementioned non-assignable logic functions, aforementioned unknown logic functions, and the logic functions for Boolean true and false to propagate each signal value throughout a circuit.

In a circuit, a signal is declared to be always non-assignable, always assignable, or conditionally non-assignable. A signal declared to be always non-assignable must always have value "U". An example of such a signal is a signal coupled to an output of a black-box. Thus, a user can designate incomplete portions of a circuit as a black-box, declare the output signals from the black-box as non-assignable, and still verify other portions (i.e., the completed portions) of the circuit design. As another example, a user can designate previously verified portions of a circuit design as a black-box, declare the output signals from the black-box as non-assignable, and still verify the non-verified sections of the circuit design.

A signal declared to be always assignable can never have the value "U" (i.e., the signal can never be non-assignable). An example of such a signal is a primary input to a circuit. A signal declared to be conditionally non-assignable can become non-assignable when a certain condition occurs, otherwise, the signal is or remains assignable. An example of such a signal is a bus-contention signal. A signal can also be declared or have the unknown value "X" in the beginning. Subsequently, when certain signal values are assigned and the values are propagated, the signal initially declared as unknown may become "0", "1", or "U".

Figure 3:
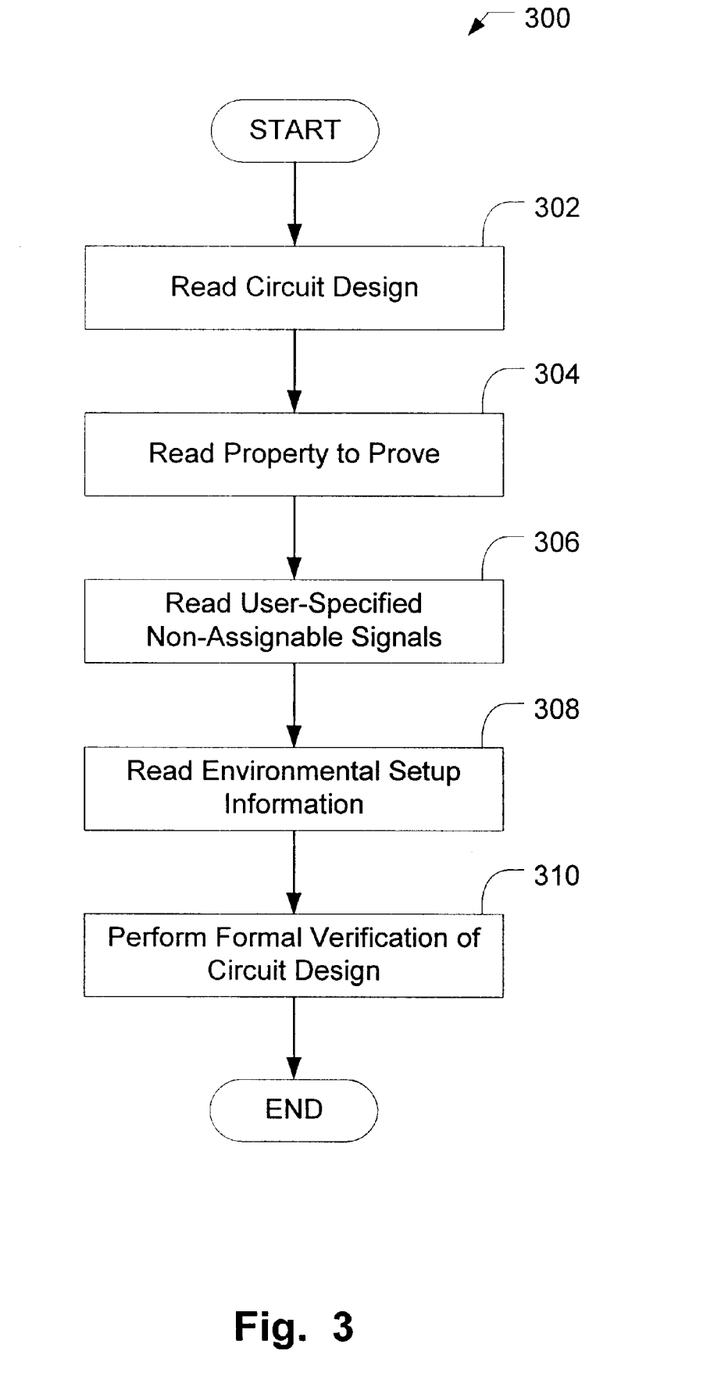
FIG. 3 is a flow chart of an overall method for performing formal verification of a circuit, according to one embodiment.

FIG. 3 is a flow chart of an overall method 300 for performing formal verification of a circuit, according to one embodiment. Beginning at a start step, a user wanting to verify a circuit design can execute verification system 100 on a computer. The circuit design can be a complete or entire circuit design or can be a part or portion of a larger circuit design. The user provides the circuit design (e.g., a filename of a file containing the circuit design) to verification system 100. Verification system 100 reads the provided circuit design (step 302).

Verification system 100 can provide an interface, such as an interactive user interface, a program interface, or both, through which verification system 100 can receive data and information. If a user specifies a property to verify, for example, through a user interface, verification system 100 reads the specified property information (step 304). In one embodiment, verification system 100 can provide a default property such as, by way of example, the output signal generated by the specified circuit design. If the user does not specify a different property, verification system 100 can proceed to verify the default property.

If the user specifies one or more non-assignable signals, verification system 100 reads the specified non-assignable signal information (step 306). In one embodiment, verification system 100 can provide a default set of non-assignable signals. For example, verification system 100 can designate signals coupled to the outputs of a black-box, unknown values due to bus contention, and floating point signals as non-assignable. The user can modify the default set of non-assignable signals or specify additional non-assignable signals.

Verification system 100 reads the environmental setup information (step 308). Verification system 100 uses the environmental setup information to initialize or set the circuit defined by the circuit design to a known state. Typically, the user provides the environmental setup information. Verification system 100 may identify environmental setup that can be designated arbitrarily without changing or affecting the verification results. For example, if the clock ports of all the registers are directly connected to the same primary input, verification system 100 can arbitrarily designate a clack waveform that will not affect the verification result.

In one embodiment, Verification system 100 models the verification target (i.e., property NOT) to verify as an attached circuit having a single output signal, which is the proposition of the vector generation target. During the verification process, verification system 100 creates a tree (e.g., a Boolean decision tree) from the elements (e.g., a portion or all of the circuit), called decision signals, that are sufficient to generate test vectors for the target. A decision signal is a signal that can be designated as having a value "0" or "1", and therefore cannot be a non-assignable signal. Each path in the created tree corresponds to a set of "0" or "1" assignments on the decision signals. Verification system 100 propagates the decision signal values together with the non-assignable signal value "U" based on the non-assignable truth table 104, and the target (i.e., the output signal) can subsequently be evaluated "0" (i.e., target is not achieved), "1" (i.e., target is achieved), or "U" (i.e., target becomes non-assignable). Verification system 100 performs formal verification (step 310), and reports or makes available the verification results to the user and ends processing.

In one embodiment, verification system 100 utilizes a depth-first search (DFS) of the decision tree to verify the specified property and generate any true counter-examples. A DFS technique is described, for example, in commonly assigned U.S. Patent Application Ser. No. 10/029,596, entitled "Solving Constraint Satisfiability For Automatic Generation Of Design Verification Vectors" filed Oct. 21, 2001, the entirety of which is incorporated herein by reference. In particular, the aforementioned patent application describes a structural word-level Automatic Test Pattern Generation (ATPG) technique that uses branch-and-bound algorithms to search for test vectors in a Boolean space (e.g., decision tree). Those of skill in the art will appreciate that the DFS technique described in the aforementioned patent application needs to be modified to account for and support the propagation and traversal of non-assignable signals and non-assignable values as disclosed herein.

In other embodiments, conventional ATPG and Boolean satisfiability (SAT) engines that use branch-and-bound algorithms to search for test vectors in the Boolean space can be used to produce true counter-examples. Those of skill in the art will appreciate that the conventional ATPG and Boolean SAT engines need to be modified to account for and support the propagation and traversal of non-assignable signals and non-assignable values as disclosed herein. The modified ATPG and Boolean SAT engines function in a ternary logic environment.

In another embodiment, verification system 100 utilizes a breadth-first search (BFS) of the decision tree to verify the specified property and generate any true counter-examples. Verification system 100 can utilize a bottom-up recursive procedure to construct a reduced-order BDD from the circuit under verification. The reduced-order BDD is a canonical representation of the target function (i.e., the function of the property NOT output signal) and the decision tree. Because non-assignable signals are included in the circuit, the resulting reduced-order BDD accounts for the non-assignable signals (e.g., each path in the reduced-order BDD leads to either a "0", "1", or "U"). Thus, verification system 100 can ignore the paths that lead to "U" and generate only true counter-examples.

In still another embodiment, verification system 100 can employ a combination of DFS and BFS to verify the specified property and generate any true counter-examples. Verification system 100 can determine from factors, such as, by way of example, the size of the circuit and the memory available to perform the verification processing, whether to utilize the DFS technique or the BFS technique to verify the property. For example, if the circuit size is determined to be smaller than a predetermined size threshold, verification system 100 can employ the BFS technique. Otherwise, verification system 100 can employ the DFS technique. In yet another embodiment, verification system 100 can first employ the BFS technique for a predetermined processing time length. Subsequently, if the property has not been proven and the entire tree has not been searched, verification system 100 can employ the DFS technique.

Those of ordinary skill in the art will appreciate that, for this and other methods disclosed herein, the functions performed in the exemplary flow charts may be implemented in differing order. Furthermore, steps outlined in the flow charts are only exemplary, and some of the steps may be optional, combined into fewer steps, or expanded into additional steps without detracting from the essence of the invention.

Depth-First Search (DFS)

Figure 4:
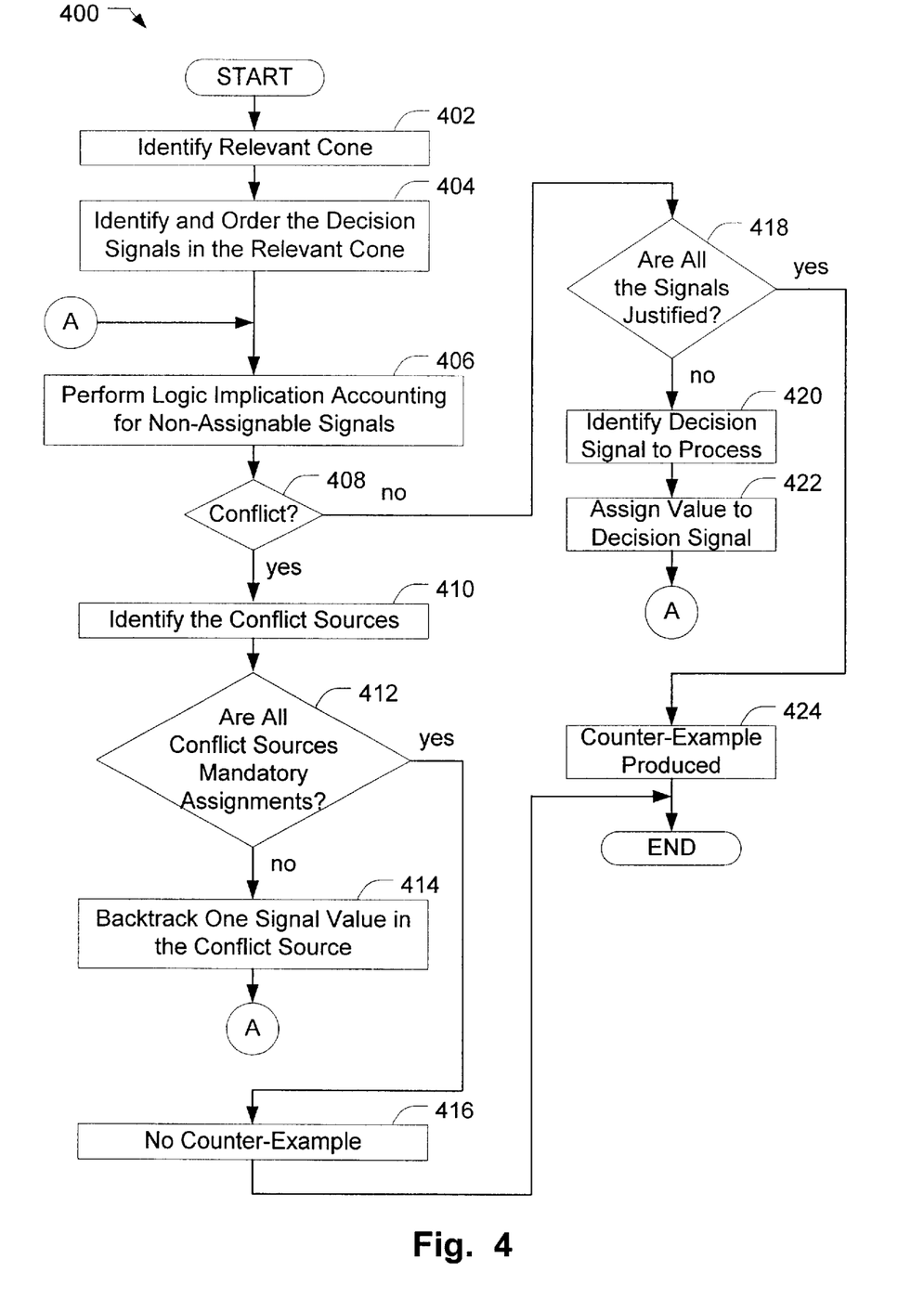
FIG. 4 is a flow chart of an exemplary method for performing formal verification utilizing a depth-first search, according to one embodiment.

FIG. 4 is a flow chart of an exemplary method 400 for performing formal verification utilizing a DFS, according to one embodiment. During a start step, verification system 100 creates the environment necessary to verify a specified property (e.g., verification system 100 performs steps 302 through 308 of FIG. 3). Verification system 100, or a component of verification system 100 such as proof engine 102, identifies a relevant cone (402). The cone is comprised of the circuit elements or components that are necessary to verify the property. Thus, the property is a factor that determines the composition of the cone.

Verification system 100 identifies and orders the decision signals in the relevant cone (step 404). Decision signals are decision candidates, and verification system 100 can make a decision as to a decision signal's value during the subsequent branch-and-bound process. Verification system 100 identifies any signal that is or can be either "0" or "1" as a decision signal. Signals declared as or that become non-assignable cannot be decision signals.

Verification system 100 orders or ranks the decision signals, for example, according to each signal's likelihood or probability of satisfying the target (i.e., property NOT). A signal that is likely to affect a larger number of other signals can be ranked higher than a signal that is likely to affect a smaller number of other signals. Verification system 100 can then operate (e.g., make signal value decisions) on the decision signals according to the established order.

Verification system 100 performs logic implication on the signals in the relevant cone (step 406). Verification system 100 propagates the signal values (i.e., "0", "1", "U") adhering to the logic rules for the non-assignable signals and assignable signals. The signals values "0" and "1" can propagate up (i.e., input to output) and down (i.e., output to input) in the cone. In contrast, the signal value "U" can only propagate up.

In one embodiment, verification system 100 can perform word-level implication. Word-level implication is described, for example, in commonly assigned U.S. Patent Application Ser. No. 10/029,596, entitled "Solving Constraint Satisfiability For Automatic Generation Of Design Verification Vectors" filed Oct. 24, 2001, the entirety of which is incorporated herein by reference. The aforementioned word-level implication needs to adhere to the non-assignable signal propagation logic as disclosed herein.

Verification system 100 checks to determine if a conflict occurred during the implication process (step 408). If there are no conflicts, verification system 100 determines whether all the signals in the cone are justified (step 418). If all the signals are justified, verification system 100 concludes that a counter-example exists and produces the counter-example (step 424) and ends processing. If any of the signals are not justified (step 418), verification system 100 identifies a decision signal to process (step 420). Verification system 100 assigns a value (e.g., "0" or "1") to the identified decision signal (step 422), indicates the decision signal as processed, and resumes processing at step 406.

If there is a conflict (step 408), verification system 100 identifies the conflict sources (step 410). Verification system 100 performs conflict analysis to identify a sufficient number of signals that caused the detected conflict. Conflict analysis enables verification system 100 to learn from prior decisions and prune out the illegal search space in the cone. The number of identifies conflict sources need not be the absolute minimum number of signals that caused the conflict.

A conflict source is either a mandatory assignment or, if not a mandatory assignment, a signal having a signal value of "0" or "1" but not "U". A mandatory assignment can be defined as a signal value that results from user-specified setup information and the implications arising from the user-specified setup information. Verification system 100 checks to determine if all of the conflict sources are mandatory assignments (step 412). If all the conflict sources are mandatory assignments, verification system 100 concludes that a counter-example cannot be produces (step 416) and ends processing. There is no decision signal to backtrack and property NOT cannot be shown because it conflicts with the preconditions (e.g., the setup information). Thus, verification system 100 can report that the property is verified.

If there is a conflict source that is not a mandatory assignment (step 412), verification system 100 must have made a decision on a decision signal. Verification system 100 backtracks a signal value for a signal identified as a conflict source (step 414) and resumes processing at step 406. In one embodiment, backtracking the signal value for the identified signal undoes the logic implications associated with the signal value and changes the signal value for the identified signal from "1" to "0" (or "0" to "1").

Breadth-First Search (BFS)

Figure 5:
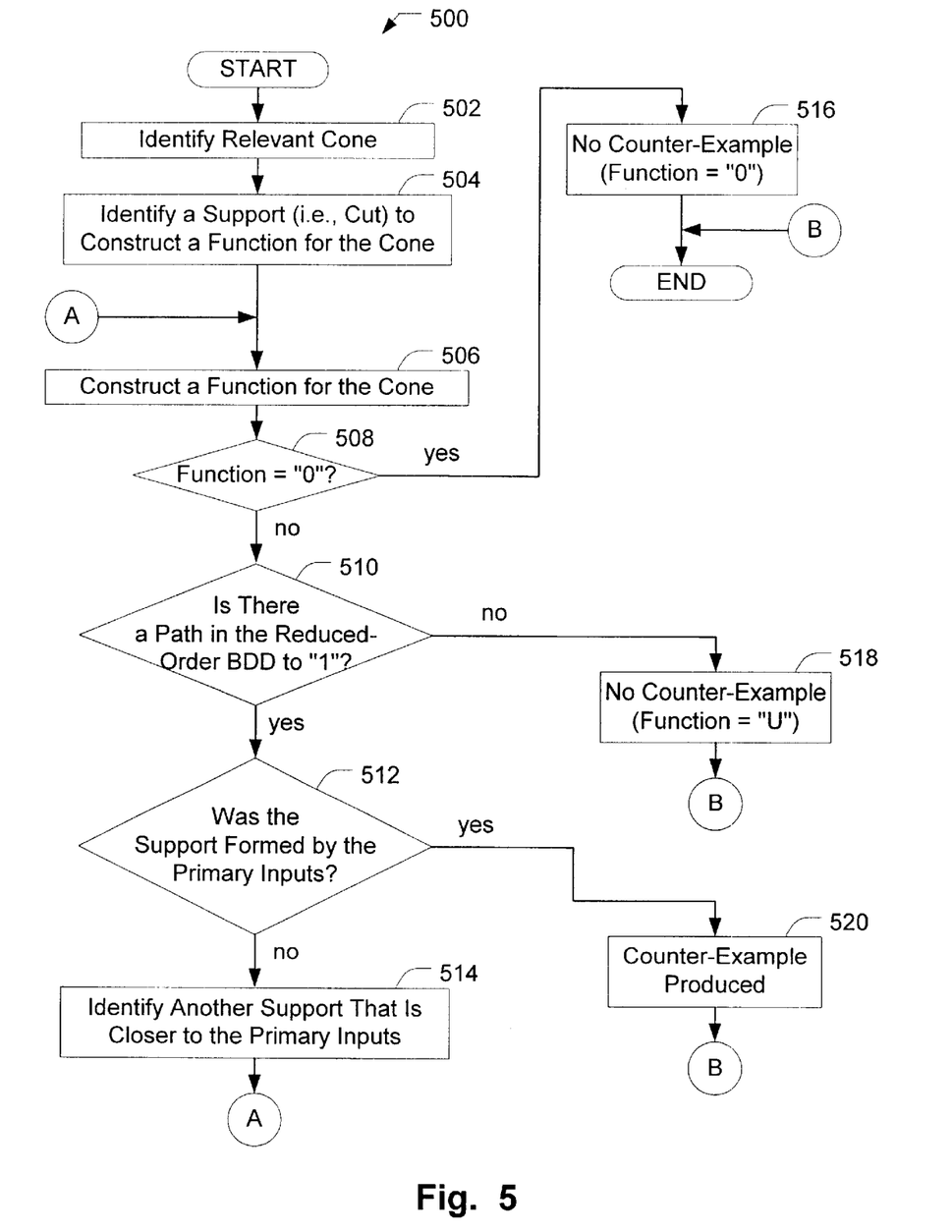
FIG. 5 is a flow chart of an exemplary method for performing formal verification utilizing a breadth-first search, according to one embodiment.

FIG. 5 is a flow chart of an exemplary method 500 for performing formal verification utilizing a BFS, according to one embodiment. During a start step, verification system 100 creates the environment necessary to verify a specified property (e.g., verification system 100 performs steps 302 through 308 of FIG. 3). Verification system 100, or a component of verification system 100 such as proof engine 102, identifies a relevant cone (502). The cone is comprised of the circuit elements or components that are necessary to verify the property. Thus, the property is a factor that determines the composition of the cone.

Verification system 100 identifies a support to construct a function for the cone (step 504). A support, also referred to as a cut or cut-set, is a set of branches in a network (e.g., cone) such that, cutting all of the branches in the support cuts the network into two segments. One of the segments can be empty, for example, when the support is the set of primary inputs. Thus, the cut separates the cone into two segments.

Verification system 100 uses the identified support to construct a function for the property NOT (e.g.,f(set of signals in the support)=property NOT) (step 506). In one embodiment, verification system 100 constructs the function by creating a reduced-order BDD, where the reduced-order BDD accounts for and supports non-assignable signals. For example, verification system 100 propagates the non-assignable signals according to the non-assignable propagation logic in creating the reduced-order BDD. Thus, the paths in the created reduced-order BDD (i.e., the function for the property NOT) potentially lead to terminal nodes having a value "0", "1" or "U".

Verification system 100 checks to determine if the function equals "0" (step 508). The function equals "0" if all the paths in the reduced-order BDD evaluate to terminal node "0". If the function equals "0", verification system 100 concludes that a counter-example does not exist (step 516) and ends processing. If the function does not equal "0" (step 508), verification system 100 checks to determine if there is a path in the reduced-order BDD that evaluates to terminal node "1" (step 510). If no path in the reduced-order BDD evaluates to terminal node "1", verification system 100 concludes that a counter-example does not exist (step 516) and ends processing. In this instance, the paths must have evaluated to terminal node "U".

If there is a path in the reduced-order BDD that evaluates to terminal node "1" (step 510), verification system 100 checks to determine if the support is formed (i.e., comprised of) by the primary inputs (step 512). If the support is formed by the primary inputs, verification system 100 concludes that a counter-example exists and produces the counter-example (step 520) and ends processing. Alternatively, if the support is not formed by the primary inputs, the support is an internal cut. In this instance, verification system 100 identifies another support that is closer to the primary inputs (step 514) and continues processing at step 506.

Those of ordinary skill in the art will realize that a BDD that supports non-assignable signals can be used in place of the reduced-order BDD. Those of ordinary skill will also realize that the BFS technique is a short-cut (i.e., a quick procedure) that enables verification system 100 to conclude that a counter-example does not exist (i.e., that property NOT cannot be "1"). But, BFS is memory intensive and, thus, possibly due to memory constraints, verification system 100 may not be able to create a BDD for the entire cone (i.e., the support is formed by the primary inputs). In this instance, verification system 100 may not be able to conclude that a counter-example exists.

This invention may be provided in other specific forms and embodiments without departing from the essential characteristics as described herein. The embodiments described above are to be considered in all aspects as illustrative only and not restrictive in any manner. The following claims rather than the foregoing description indicate the scope of the invention.

What is claimed is:

1. A method for supporting non-assignable signals during formal verification of a circuit design, the method comprising:

providing a propagation logic for non-assignable signals;

identifying a relevant cone in a circuit design, the relevant con determined by a property to verify;

designating one or more signals in the circuit design as non-assignable signals;

propagating within the relevant cone any of the designated one or more non-assignable signals using the propagation logic for non-assignable signals; and if a counter-example disproving the property exists, ensuring that the counter-example does not comprise any of the one or more designated non-assignable signals.

2. The method of claim 1, wherein propagating any of the designated one or more non-assignable signals is performed during logic implication.

3. The method of claim 1 further comprising identifying one or more decision signals in the relevant cone, the decision signals does not comprise any of the one or more designated non-assignable signals.

4. The method of claim 1 further comprising constructing a function for the relevant cone, wherein constructing the function comprises propagating any of the designated one or more non-assignable signals.

5. A method for ignoring non-assignable signals in generating counter-examples during formal verification of a circuit, the method comprising:

providing a propagation logic for non-assignable signals;

determining a property to verify;

identifying a relevant cone in the circuit design, the relevant cone being an attached circuit having an output signal, the attached circuit comprising a plurality of signals;

assigning values to some or all of the plurality of signals, the values declaring each of the assigned signals as either logical true, logical false, unknown, or non-assignable; and propagating within the relevant cone the values assigned to some or all of the plurality of signals using the propagation logic for non-assignable signals.

6. The method of claim 5 further comprising performing a depth-first search of the relevant cone.

7. The method of claim 6, wherein the depth-first search comprises Automatic Test Pattern Generation.

8. The method of claim 5 further comprising performing a breadth-first search of the relevant cone.

9. The method of claim 8, wherein the breadth-first search comprises generating a Binary decision diagram representation of the relevant cone.

10. The method of claim 8, wherein the values declare each of the assigned signals as either a first logical value, a second logical value, a third logical value, or a fourth logical value.

11. A computer-readable storage medium having stored thereon computer instructions that, when executed by a computer, cause the computer to:
   identify a relevant cone in a circuit design, the relevant cone determined by a property to verify;
   designate one or more signals in the circuit design as non-assignable signals;
   propagate within the relevant cone any of the designated one or more non-assignable signals using a propagation logic for non-assignable signals; and
   if a counter-example disproving the property exists, ensure that the counter-example does not comprise any of the one or more designated non-assignable signals.

12. The computer-readable storage medium of claim 11, wherein propagating any of the designated one or more non-assignable signals is performed during logic implication.

13. The computer-readable storage medium of claim 11, wherein the computer instructions that identify the relevant cone further comprise computer instructions that, when executed by a computer, cause the computer to identify one or more decision signals in the relevant cone, the decision signals does not comprise any of the one or more designated non-assignable signals.

14. The computer-readable storage medium of claim 11, wherein the computer instructions that identify the relevant cone further comprise computer instructions that, when executed by a computer, cause the computer to construct a function for the relevant cone, wherein the function is constructed by at least propagating any of the designated one or more non-assignable signals.

15. A computer-readable storage medium having stored thereon computer instructions that, when executed by a computer, cause the computer to:
   provide a propagation logic for non-assignable signals;
   determine a property to verify;
   identify a relevant cone in the circuit design, the relevant cone being an attached circuit having an output signal, the attached circuit comprising a plurality of signals;
   assign values to some or all of the plurality of signals, the values declaring each of the assigned signals as either logical high, logical low, unknown, or non-assignable; and
   propagate within the relevant cone the values assigned to some or all of the signals using the propagation logic for non-assignable signals.

16. The computer-readable storage medium of claim 15, wherein the computer instructions that identify the relevant cone further comprise computer instructions that, when executed by a computer, cause the computer to perform a depth-first search of the relevant cone.

17. The computer-readable storage medium of claim 16, wherein the depth-first search comprises Automatic Test Pattern Generation.

18. The computer-readable storage medium of claim 15, wherein the computer instructions that identify the relevant cone further comprise computer instructions that, when executed by a computer, cause the computer to perform a breadth-first search of the relevant cone.

19. The computer-readable storage medium of claim 18, wherein the breadth-first search comprises a Binary decision diagram representation of the relevant cone.

20. The computer-readable storage medium of claim 15, wherein the values declare each of the assigned signals as either a first logical value, a second logical value, a third logical value, or a fourth logical value.

21. A formal verification system that supports the designation of non-assignable signals comprising:
   a non-assignable signal truth table specifying a propagation logic for non-assignable signals; and
   a proof engine coupled to the non-assignable truth table, the proof engine operable to determine a property to verify in a circuit, the proof engine also operable to identify a relevant cone in the design circuit based on the property, the relevant cone comprises a plurality of signals, the proof engine further operable to designate one or more signals as non-assignable and propagate the non-assignable signals using the propagation logic from the non-assignable signal truth table, and operable to ignore the non-assignable signals in generating any counter-example.

22. The system of claim 21, wherein the proof engine is further operable to identify one or more decision signals in the relevant cone, the one or more decision signals does not comprise any of the one or more signals designated as non-assignable.

23. The system of claim 21, wherein the proof engine is further operable to perform a depth-first search of the relevant cone.

24. The system of claim 21, wherein the proof engine is further operable to perform a breadth-first search of the relevant cone.

25. A formal verification system that ignores non-assignable signals in generating any counter-examples, the system comprising:
   a means for providing a propagation logic for non-assignable signals;
   a means for identifying a relevant cone in a circuit design, the relevant cone determined by a property to verify;
   a means for designating one or more signals in the circuit design as non-assignable signals;
   a means for propagating within the relevant cone any of the designated one or more non-assignable signals using the propagation logic for non-assignable signals; and
   a means for ensuring that any counter-example generated does not comprise any of the one or more designated non-assignable signals.

* * * * *